United States Patent [19]

Strickler et al.

[11] Patent Number: 5,289,407
[45] Date of Patent: Feb. 22, 1994

[54] METHOD FOR THREE DIMENSIONAL OPTICAL DATA STORAGE AND RETRIEVAL

[75] Inventors: James H. Strickler; Watt W. Webb, both of Ithaca, N.Y.

[73] Assignee: Cornell Research Foundation, Inc., Ithaca, N.Y.

[21] Appl. No.: 733,030

[22] Filed: Jul. 22, 1991

[51] Int. Cl.$^5$ .................... G11C 11/42; G11C 13/04
[52] U.S. Cl. .................................... 365/106; 365/127
[58] Field of Search .............. 365/106, 107, 120, 127, 365/118, 119; 356/345

[56] References Cited

U.S. PATENT DOCUMENTS

| | | | |
|---|---|---|---|
| 3,013,467 | 12/1961 | Minsky | 356/432 |
| 3,508,208 | 4/1970 | Duguay et al. | |
| 3,848,095 | 11/1974 | Wohlmut et al. | |
| 3,855,426 | 12/1974 | Bouwhuis | |
| 3,946,367 | 3/1976 | Wohlmut et al. | |
| 3,999,008 | 12/1976 | Bouwhuis et al. | 358/128 |
| 3,999,009 | 12/1976 | Bouwhuis et al. | 358/128 |
| 4,041,476 | 8/1977 | Swainson | 358/302 |
| 4,078,229 | 3/1978 | Swanson et al. | 350/354 X |
| 4,090,031 | 5/1978 | Russell | 358/130 |
| 4,163,600 | 8/1979 | Russell | 350/6.7 |
| 4,219,704 | 8/1980 | Russell | 365/119 X |
| 4,288,861 | 9/1981 | Swainson et al. | 365/127 |
| 4,333,165 | 6/1982 | Swainson et al. | 365/120 |
| 4,450,553 | 5/1984 | Holster et al. | 369/275 |
| 4,466,080 | 8/1984 | Swainson | 365/106 |
| 4,471,470 | 9/1984 | Swainson et al. | 365/127 |

OTHER PUBLICATIONS

"Dry Photopolymer Embossing: Novel Photoreplication Technology for Surface Relief Holographic Optical Elements", SPIE vol. 1507 Holographic Optics III: Principles and Applications (1991) pp. 383-391 Felix P. Shvartsman.

"Optical Measurement of Picometer Displacements of Transparent Microscopic Objects", Denk et al; *Applied Optics*, vol. 29, No. 16 1 Jun. 1990, pp. 2382-2390.

"Experimental Holographic Read-Write Memory Using 3-D Storage", d'Auria et al, *Applied Optics*, vol. 13, No. 4, Apr. 1974, pp. 808-818.

"Three-Dimensional Optical Storage Memory", Parthenopoulos, *Science* vol. 245, 25 Aug. 1989; pp. 843-845.

"Two-Photon Laser Scanning Fluorescence Microscopy", Denk et al *Science*, 6 Apr. 1990, vol. 248; pp. 73-76.

*Primary Examiner*—Joseph A. Popek
*Attorney, Agent, or Firm*—Jones, Tullar & Cooper

[57] ABSTRACT

In a method of high density ($>10^{12}$ bits/cc) optical recording of information in a three-dimensional multilayered format, information is written in a photopolymer as submicron volume elements of altered index of refraction. The index change results from alteration of the photopolymer induced by two-photon excitation of the photo-sensitizer at the waist of a highly focused beam from a subpicosecond colliding pulse modelocked laser. Quadratic dependence of two-photon excitation on incident instantaneous intensity serves to confine crosslinking of the polymer to the focal volume; hence, bit array layers may be written with thicknesses on the order of the confocal parameter. As an example, eight well resolved bit planes can be written in a olymer film about 30 microns thick. Information written in this manner may be read with sufficient axial resolution by differential interference contrast (DIC) or confocal microscopy. This technique may be employed in multilayered write once read many (WORM) optical storage discs, for example.

27 Claims, 4 Drawing Sheets

METHOD FOR THREE DIMENSIONAL OPTICAL DATA STORAGE AND RETRIEVAL

BACKGROUND OF THE INVENTION

This invention was made with Government support under Grant No. P41RR04224 awarded by the National Institutes of Health, and under Grant No. DIR8800278, awarded by the National Science Foundation. The Government has certain rights in the invention.

The present invention relates, in general, to a method of storing data in a three-dimensional medium, and more particularly to optical data storage techniques utilizing two-photon excitation in refractive media.

Conventional two-dimensional optical data storage can register information at about $10^8$ bits/cm$^2$ using visible or infrared wavelengths at the diffraction limit. It has been proposed that by writing and reading data in a three-dimensional format, data storage densities of greater than $10^{12}$ bits/cm$^3$ could be achieved. See, for example, U.S. Pat. Nos. 4,466,080 and 4,471,470 to Swainson et al, which disclose the use of two intersecting beams of radiation which are matched to selected optical properties of an active medium to form and to detect inhomogeneities. In such a system, a stack of two-dimensional (2-D) planar bit arrays effectively multiplies data density by the number of planes in a three-dimensional (3-D) stack. Although the chief difficulty with such a scheme is cross talk between planes, writing with three dimensional resolution in thick media can be accomplished by non-linear excitation of the media to confine data storage to the selected focal plane. To see how this can be done, consider a single focused Gaussian beam, well below saturating intensity, incident on a physically thick but optically thin absorbing sample. For the case of excitation that is linear in the direction of the incident radiation, the same amount of energy is absorbed in each plane transverse to the optical axis regardless of distance from the focal plane, since nearly the same net photon flux crosses each plane. Thus, linear excitation strongly contaminates planes above and below the particular focal plane being addressed. For an excitation scheme which depends quadratically on the intensity, however, net excitation per plane falls off with the inverse of the square of the distance from the focal plane. Therefore, information can be written in a particular focal plane without significantly contaminating adjacent planes beyond the Rayleigh range $Z_o = \pi w_o^2 n/\lambda$, where n is the medium index of refraction, $\lambda$ is the wavelength, and $w_o = 1.22\lambda/\text{N.A.}$ The minimum spot size may be approximated by the Rayleigh criterion for a round aperture.

U.S. Pat. Nos. 4,466,080 and 4,471,470 proposed the use of two or more intersecting beams to localize the writing and reading of information on 3-D photochromic optical memories. U.S. Pat. No. 5,034,613 to Denk et al, the disclosure of which is incorporated herein by reference, proposed a simpler scheme employing a single highly focused beam to record and read via two-photon excitation. Subsequently, the applicants herein demonstrated high density optical data storage via two-photon photoactivation of a fluorescent dye which was non-fluorescent until photochemically modified, as described in "Two-photon Excitation in Laser Scanning Fluorescence Microscopy", Proceedings of the International Society for Optical Engineering, Vol. 1398, pp. 107-117, 1991. However, memories which rely on fluorescence modulation suffer the limitation that their useful lifetime is limited by photobleaching.

SUMMARY OF THE INVENTION

The foregoing problems are overcome, in accordance with the present invention, through the provision of optical techniques for writing and reading data in a three dimensional multilayered format wherein the information is written as submicron voxels of modified index of refraction that are induced by two-photon excited crosslinking or degradation of polymer media in the volume defined by the waist of a highly focused modelocked laser. Information so stored is later read with three dimensional resolution via laser differential interference contrast microscopy. These techniques allow storage of data at an unprecedented density of greater than $10^{12}$ bits/cc., and their application to a spinning disc format has the potential to produce memory devices having 100 times greater information storage capacity than currently available 2-D disc machines. The method also appears suitable for the fabrication of computer generated volume holograms of the type which have been proposed for important applications in optical computing.

Two-photon excitation refers to the simultaneous absorption of two photons by a chromophore molecule. Frequently, real excited states which are normally accessed via single photon absorption may also be excited via absorption of two quanta each having half the energy of the single photon. The essential characteristic of the process in the present context is that the photons must simultaneously impinge on the molecule; thus, the excitation rate is proportional to the square of the incident intensity. Excitation is thereby confined to the ellipsoidal focal volume where the intensity is extremely high. Such excitation is produced, in the preferred form of the invention, by a laser which provides sufficient incident intensity to produce simultaneous absorption of two photons by the photopolymer molecules, each photon having one-half the energy required for normal single photon absorption.

BRIEF DESCRIPTION OF THE DRAWINGS

The foregoing, and additional objects, features and advantages of the present invention will become apparent to those of skill in the art upon a reading of the following detailed description of a preferred embodiment thereof, taken in conjunction with the accompanying drawings, in which.

DESCRIPTION OF PREFERRED EMBODIMENT

Two-photon photo-initiation of a crosslinking reaction in a material such as polymer which leads to a density increase of the material and concomitant increase in the index of refraction may be used to write phase data in three dimensions. Applicants have found that a liquid acrylate ester blend such as CIBATOOL XB5081, available from 3d Systems, Valencia Cal., may be solidified by two-photon excitation using highly focused high peak power pulsed laser irradiation of 620 nm wavelength. Upon exposure, solidified regions of this material become visible within the liquid due to refraction, suggesting this sort of material as a candidate for an optical memory medium. Many photoresists are known to undergo density changes upon either cross-linking or photodegradation and should also be useful as phase recording memory media. Furthermore, reversible photorefractive materials may potentially be used as erasable optical memories. Such materials have already been used in holographic three dimensional data recording schemes but only with considerably lower data storage density.

As with the case of fluorescent memories, refractile memories must be read via a technique which has axial resolution as high as the writing method and which discriminates against an out of focus background. Differential interference contrast microscopy (DIC), which is a well-known technique of microscopy, may be made to be sensitive to optical path differences originating only at the focal plane. This is accomplished by using laser beams to scan the material, instead of illuminating the full field, so that two focused cross polarized components of a plane polarized source beam are made to pass through the specimen separated by a small distance ($<1$ $\mu$m) in the transverse direction. At the focal plane, where the component beams are closely adjacent, or overlap by only a small amount, they will suffer a relative phase shift if the two beams pass through regions of different refractive indices. By detecting and then recombining these beams so that they interfere in the image plane, and by analyzing the polarization of the detected beams relative to the source beam polarization, it is possible to measure the relative phase shift that occurred between the two beams within the material at the focal plane. By raster scanning the focused beams through the material and displaying the detected intensity on a CRT, an image of the transverse gradient of the index of refraction at the focal plane is produced. Since the component beams are largely overlapping outside of the focal plane this technique is sensitive to information only at the focal plane. Phase sensitivity can be further improved by recording two orthogonal polarizations and computing a normalized differential signal. (See, for example, W. Denk and W. W. Webb, *Applied Optics*, Vol. 29, p. 2382 (1990)).

Figure 1:
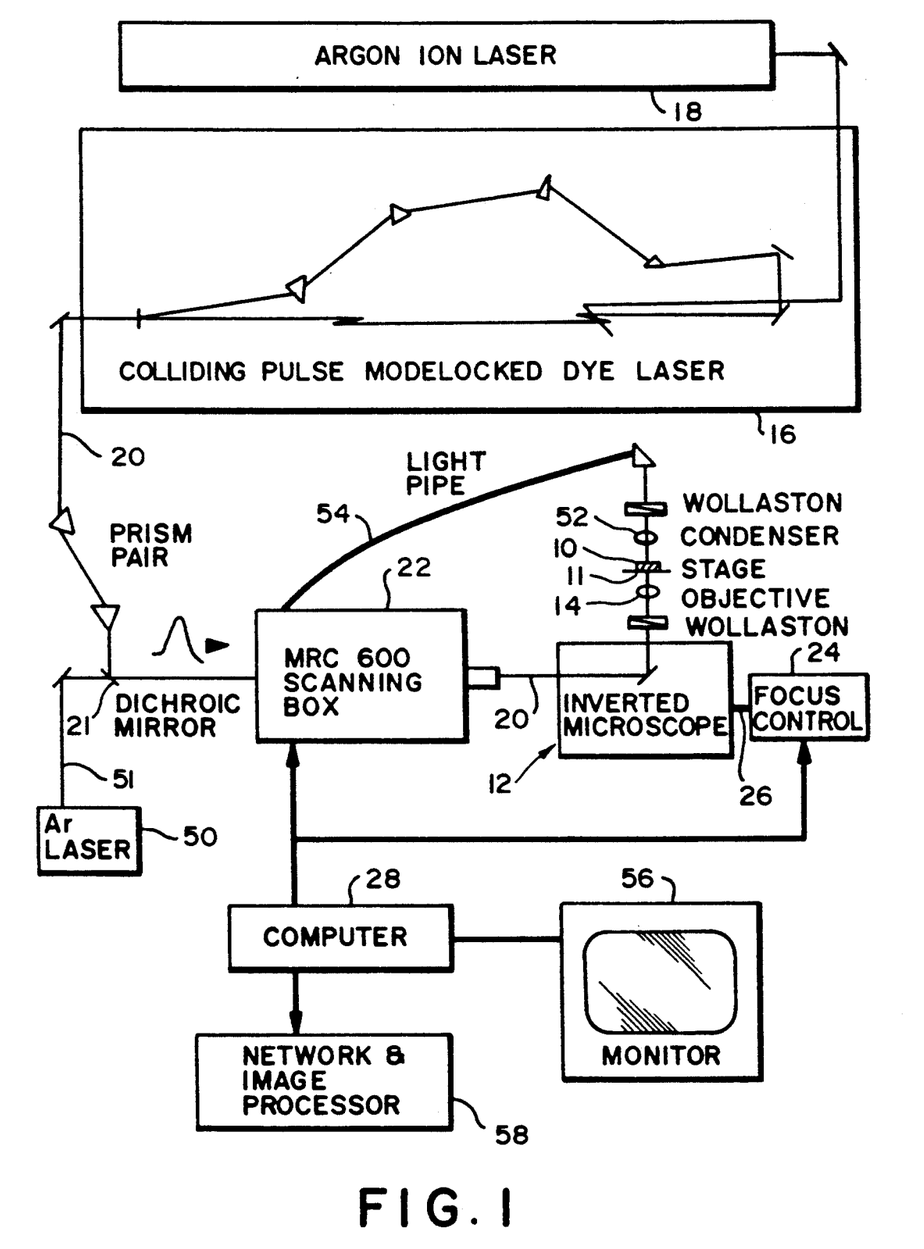
FIG. 1 is a diagrammatic illustration of experimental apparatus for writing and reading three dimensional refractile optical memories, in accordance with the invention.

An optical memory in accordance with the present invention may be in the form of a film of the photopolymer CIBATOOL, which may be prepared for data storage as an approximately 100 $\mu$m thick film sample placed between a microscope slide and a coverslip. The film sample is first irradiated with about 3 mJ/cm$^2$ of UV light in order to gel the sample and thereby prevent distortion due to shrinkage and flow. Sample 10 is then placed on the stage of an inverted microscope generally indicated at 12, and which may be a Zeiss Model IM-35. The sample is irradiated for data storage through a high numerical aperture (N.A.) objective lens 14, such as a Nikon planapo 6×1.4 N.A., with 100 fs pulses of, for example, 620 nm wavelength light from a colliding pulse modelocked dye laser diagrammatically illustrated at 16, pumped by an Argon ion laser 18. Laser beam 20 is supplied to microscope 12 by way of dichroic mirror 21 and computer controlled scanning mirrors (not shown) of a laser scanning confocal microscope 22 such as model MRC-600 from Bio-rad. The sample 10 carried on stage 11 is translated in the axial, or Z, direction by a stepper motor focus controller 24 which is connected to the focusing knob 26 of the microscope 12, and which is controlled by a computer 28. The computer 28 is also connected to the scanning mirrors of microscope 22 to control the X-Y translation of the irradiating beam 20 from laser 16 on the sample.

By moving the laser beam 20 in the X-Y direction, a two-dimensional bit plane is defined, with transverse locations being scanned by the beam 20 to define data points in that plane. By moving the objective lens 14 in the Z direction so as to focus at different planes, different two-dimensional bit planes are defined so that three-dimensional stacks of data can be written into the sample. Writing occurs when the light focused at a location in the sample has sufficient instantaneous intensity to modify the material of the sample, as by producing two-photon photopolymerization of the sample material. Such a polymerization produces a change in a characteristic of the specimen material, such as a change in its refractive index, at a very small point, or pixel, in the material. This change produces a bead of material which is different than surrounding material outside the focal point of the scanning beam and thus outside the region of two-photon excitation of the sample material, and this change may be referred to as a data bit at that focal point, or pixel location.

In accordance with experiments utilizing the apparatus of FIG. 1, the X-Y scanning and the Z-direction focus is shifted by the computer 28 periodically in a predetermined pattern to provide a dwell time for the scanning beam of about 10 ms at each selected pixel location. The dye laser 16 produces intense 100 fs pulses of light at the repetition rate of 100 MHz to produce 2-3 mW average power. Exposure of the material at each selected pixel location to this light for a period of about 10 ms produces a three-dimensional array of distinct, nonoverlapping optically refractive beads at the selected locations in the specimen. This array is in the form of stacked layers of X-Y data bit planes, with the refractive beads representing data bits.

Figure 2:
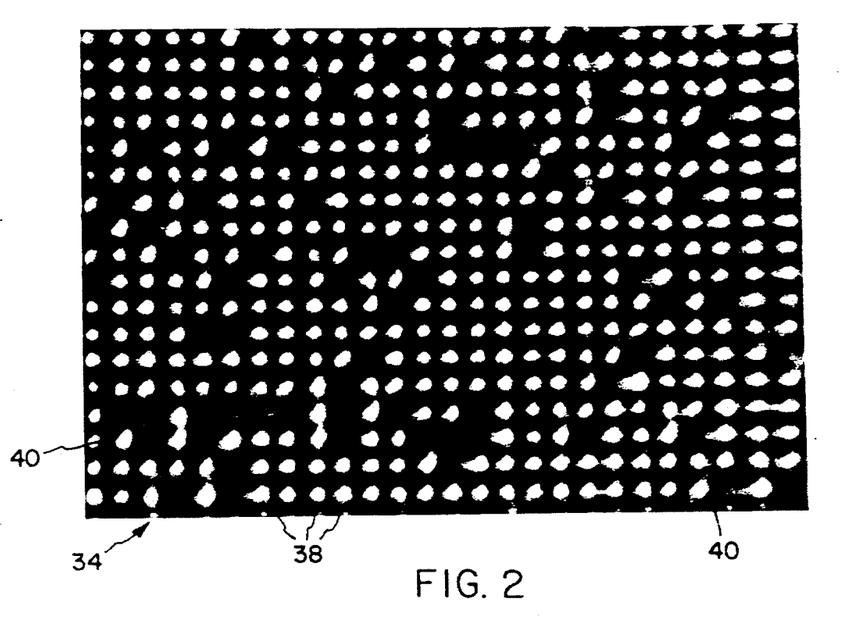
FIGS. 2 and 3 are images of adjacent random bit planes taken from a stack after they were written as a three-dimensional optical memory by the apparatus of FIG. 1.
Figure 3:
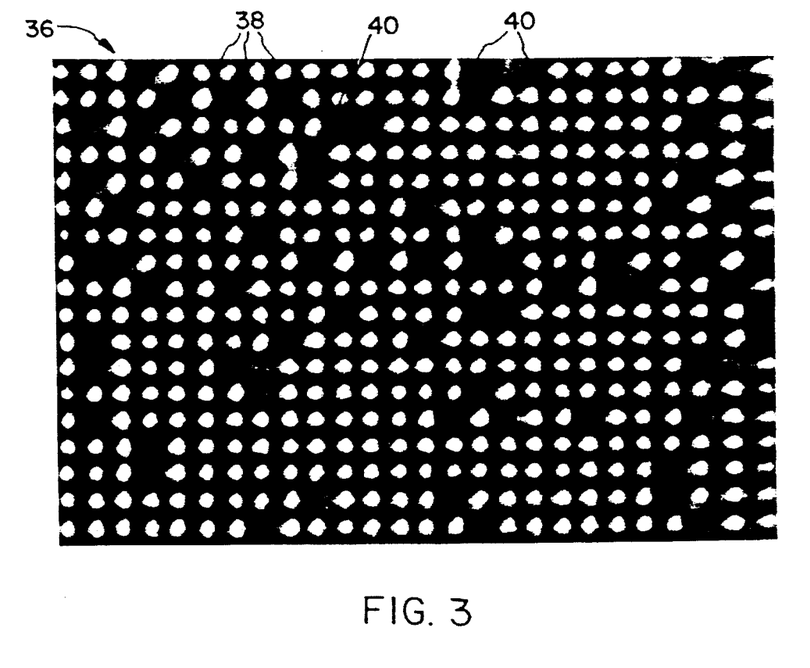

Optically refractive beads formed in an array in accordance with the foregoing are illustrated in FIGS. 2 and 3, wherein a pair of adjacent bit planes 34 and 36 are illustrated as including multiplicities of pixel locations 38. The planes 34 and 36 were adjacent to each other in a stack, with the adjacent planes being separated by about 3 micrometers. The pixel locations in each plane are separated in transverse directions by about 1 micrometer, center to center, producing a bit density of $0.3 \times 10^{12}$ bits/cm$^3$ in the stack. Data written into pixel locations on the two planes are indicated by grey regions 40.

Figure 4:
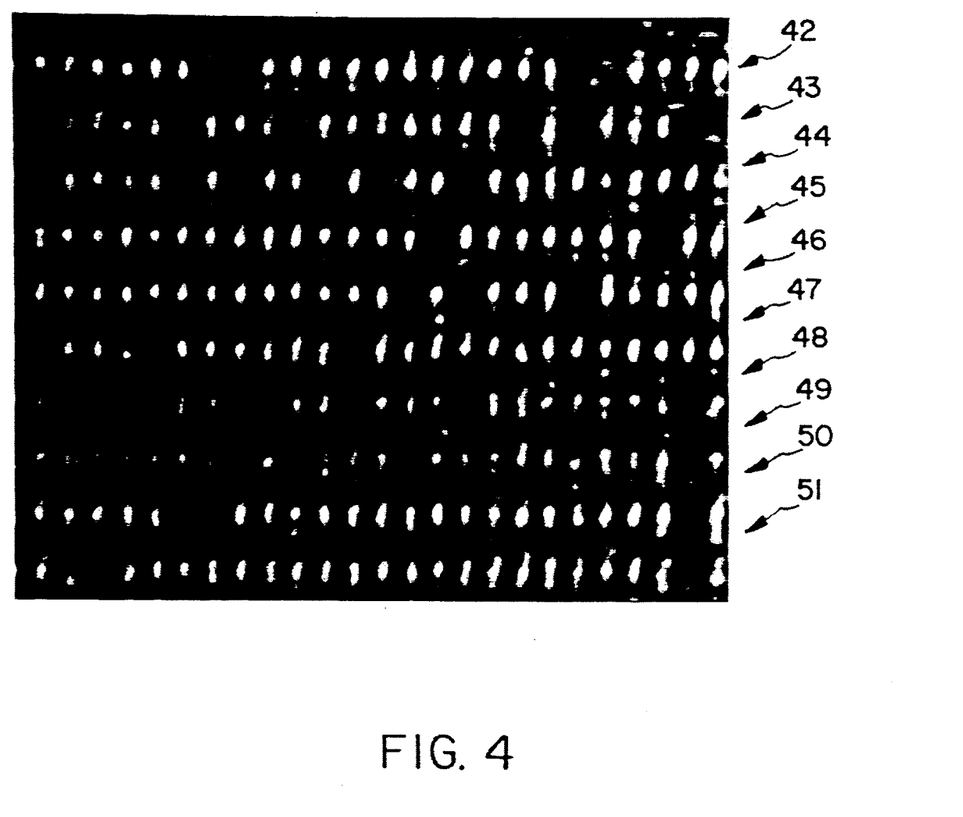
FIG. 4 is an image of a longitudinal cross-section through a stack of 10 of the planes of FIGS. 2 and 3.
Figure 5:
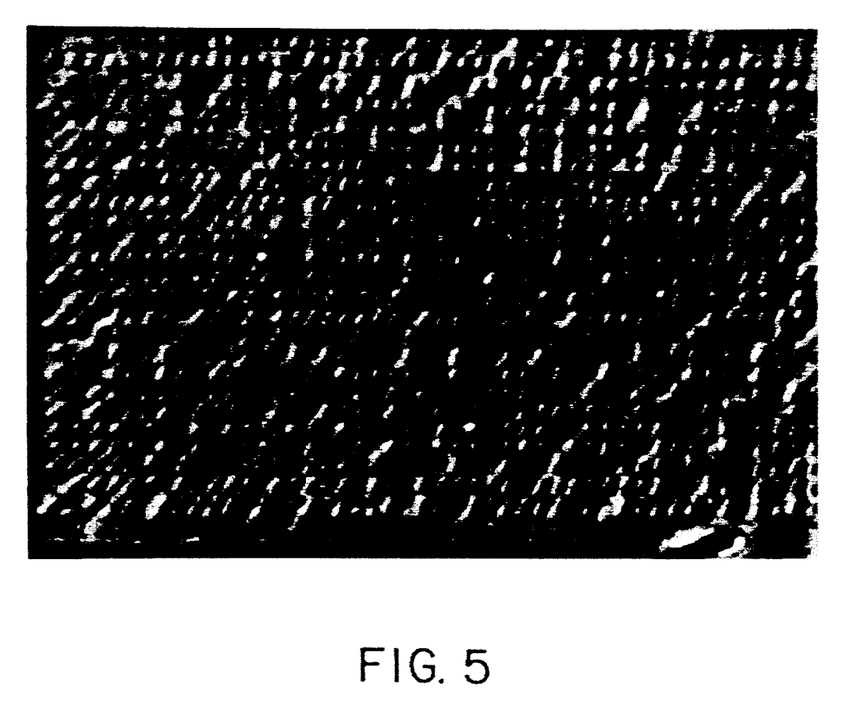
FIG. 5 is an image of a longitudinal cross-section through the central region of a 25 layer memory stack.

A longitudinal cross-section through a stack of 10 planes, generally indicated at 42-51, is illustrated in FIG. 4. The planes in this stack are separated in the Z direction by 3 micrometers, as noted above. Similar structures up to 30 planes thick, with data densities of $1.6 \times 10^{12}$ bits/cm$^3$, have been generated, with FIG. 5 showing a section from a 25-layer structure, having a density of $1.3 \times 10^{12}$ bits/cm$^3$. It is noted that in the image of FIG. 4, a second order background subtraction has been digitally performed to remove the field ramp produced by the DIC imaging method.

The optical memory formed by the foregoing process may be read by successively imaging each of the data-containing planes, such as planes 42-51, by directing laser light into the sample 10 carried by stage 11, again using the optics of the laser scanning microscope 22. The presence or absence of optically refractive beads, at specified X,Y and Z pixel locations in the sample can then be determined, so as to retrieve the data previously written. More particularly, an Argon ion laser 50 (FIG. 1) directs a read beam 51 of light at a wavelength of 488 nm, for example, onto the specimen by way of dichroic mirror 21, the scanning mirrors of the laser confocal microscope 22, and the optics of the inverted microscope 12. The read beam 51 passes through the specimen and through lens 52 to a suitable light pipe 54 which directs the light to a photomultiplier light detector which forms a part of laser scanning microscope 22. The read beam scans each layer of the stack in the X-Y plane to produce a corresponding image, and by successively focusing the microscope 12 on the various planes by way of focus control 24, each layer of the stack can be read. The plane images so produced may be displayed on monitor 56 and may be supplied to suitable processing circuitry to determine the locations of those pixels which include data bits, for example in the form of refractory beads formed by the data writing process described above.

As discussed above, to read, or image, the closely spaced bit planes of a sample, differential interference contrast (DIC) microscopy, as described by G. Nomarski, Journal Phys Radium 16, 9s-11s (1955), is used, since it is sensitive to optical path differences originating only at the focal plane in the sample. The laser scanning microscope converts the plane polarized read beam 51 into two focussed cross polarized components which pass through the sample 10 separated by a small distance (less than 1 micrometer) in the transverse direction. At the focal plane in the specimen, where the component beams barely overlap, they will undergo a relative phase shift, caused by one of the beams passing through a pixel, or data bit region, where the index of refraction has changed while the other beam passes through an adjacent region that is unchanged. After passing through the sample, these beams are recombined so that they display an interference pattern in the image plane. By analyzing the polarization of the image beams with respect to the source polarization, it is possible to measure the relative phase shift produced in the beams at the focal plane.

By scanning the focused beams across each layer of the sample in sequence, an image of the transverse gradient of the index of refraction for a stack of data planes can be produced.

Three-dimensional refractile data storage is entirely adaptable to the rotating disc format used in current commercial optical data storage products. A reading device requires incorporation of DIC transmission optics, and a recording (or writing) device requires a high peak power ultrafast modelocked laser source or other convenient short pulse source. Alternatively, resonance enhanced two photon absorbing media may provide much higher two-photon cross sections that could allow recording with a conventional laser diode.

Because the volume of the written bit depends on $1/(N.A.)^4$, the use of high numerical aperture focusing optics is essential to maximize data density. While using a nonimmersion objective with, for example, N.A.=0.9 may reduce the data density by a factor of 6 relative to the best oil immersion objectives, the theoretical limit remains at about $10^{12}$ bits/cm$^3$. Furthermore, since the number of layers that may be written depends on the lens working distance, dry lenses should allow use of a thicker memory structure with more data layers.

While the writing speed of the experimental system described above is relatively slow, an increase of the power of the incident beam by a factor of 100 using currently available lasers would increase the writing speed for this material by 10,000. By judicious optimization of material and irradiation wavelength for high two-photon absorption cross section, and by use of higher incident power, submicrosecond voxel writing times are anticipated. The writing time may ultimately be limited only by the repetition rate of the pulsed laser, while the maximum reading speed for the 3-D optical memory should be limited only by the mechanics of the scanning system and the spinning disc, as in current 2-D systems.

Although the present invention has been described in terms of a preferred embodiment, it will be understood that variations and modifications may be made without departing from the true spirit and scope thereof, as set forth in the following claims.

What is claimed is:

1. A method for writing optical data with three-dimensional resolution, comprising:
    producing a single, intense beam of focusable, coherent light;
    focussing the beam on a photosensitive material to produce two-photon excitation of said material at the focal point of the beam to thereby produce a detectable characteristic change in said material.

2. The method of claim 1, wherein the characteristic change produced by said two-photon excitation is a refractive index inhomogeneity in said material at said focal point.

3. The method of claim 1, wherein the characteristic change produced by said two-photon excitation is a refractive index inhomogeneity resulting from modification of the density of the photosensitive material.

4. The method of claim 1, further including:
    scanning said beam through said material to produce characteristic changes in said material at selected locations to thereby produce three-dimensional inhomogeneities therein.

5. The method of claim 4, wherein the step of scanning said beam includes moving a focal point of said beam in an X-Y plane within said material to define a plurality of pixel locations in said X-Y plane.

6. The method of claim 5, wherein the step of scanning said beam further includes shifting the focal point of said beam along a Z axis to define a plurality of X-Y planes within said material, to thereby define a three dimensional array of pixel locations in said material.

7. A method of reading optical data stored as a refractive index inhomogeneity in a medium, comprising:
    producing a polarized laser read beam;
    producing from said read beam a pair of focused cross-polarized component beams;
    focussing said component beam pair at adjacent locations in a medium containing inhomogeneities, and
    scanning said focussed beams through said medium to produce an optical interference signal indicative of inhomogeneities in said medium.

8. A method of writing and subsequently reading optical data with three-dimensional resolution, comprising:
    providing a three-dimensional medium of photosensitive material capable of modification by the application of light of a predetermined intensity;

producing a single, intense beam of light;

focussing said beam of light at a focal point within said medium;

scanning said focal point through said medium to produce at selected points in said medium two-photon excitation of said medium to produce a modification of a selected characteristic of the medium, each such modification representing an optical data bit in said medium; and thereafter reading optical data bits produced in said medium by scanning a focused reading beam through said medium to produce an interference pattern corresponding to said optical data bits.

9. A method of reading optical data stored as a refractive index inhomogeneity in a medium, comprising:

producing a polarized laser read beam;

producing from said read beam a pair of divergent cross-polarized component beams;

focusing said component beam pair at adjacent locations in a medium containing index inhomogeneities;

collecting the component beam pair transmitted through said medium;

recombining the transmitted component beam pair to produce a recombined beam; and analyzing polarization of the recombined beam to produce a signal beam indicative of refractive index inhomogeneities in the medium.

10. The method of reading optical data as in claim 9, the step of producing said pair of component beams includes passing said read beam through a birefringent prism.

11. The method of reading optical data as in claim 9, wherein the step of producing said pair of component beams includes passing said read beam through a Wollaston type prison.

12. The method of reading optical data as in claim 9, wherein the step of recombining said transmitted component beams includes passing said transmitted component beam pair through a birefringent prism.

13. The method of reading optical data as in claim 9, wherein the step of recombining said transmitted component beams includes passing said transmitted component beam pair through a Wollaston type prism.

14. The method of claim 9 further including scanning said read beam and said medium relative to one another to produce a time varying signal indicative of a stream of data.

15. The method of claim 1, wherein the step of producing a single intense beam of light includes generating in a colliding pulse modelocked dye laser a stream of coherent light pulses having pulse lengths in the range of 100 fs and having a repetition rate in the range of 100 MHz.

16. The method of claim 15, wherein the step of focussing said stream of pulses includes directing said stream of light pulses through a focussing lens to produce an ellipsoidal focal volume of high intensity light at a selected location within said photosensitive material, the intensity of light in said focal volume at said selected location being sufficiently high to produce simultaneous absorption of two photons by said photosensitive material to provide a characteristic change in said material to represent a data pixel, said material being nonresponsive to single photon excitation so that the intensity of light outside said focal volume is insufficient to produce said characteristic change.

17. The method of claim 16, further including scanning said focal volume of said beam through said material to define plural data pixel locations therein.

18. The method of claim 17, wherein the step of scanning said focal volume includes scanning in X, Y and Z directions through said material to define a three-dimensional array of data pixels.

19. The method of claim 18, further including directing focused read beams through said material to produce an image of said three-dimensional array of data pixels to thereby read data stored in said array.

20. The method of claim 19, wherein the step of directing focused laser read beams includes:

producing a polarized laser read beam;

producing from said laser read beam a pair of focused cross-polarized component beams;

successively focussing said component beam pair at selected pixel locations in said material; and detecting the image of said pixel locations produced by said component beam pair.

21. The method of claim 20, wherein the step of detecting the image of said pixel locations includes recombining said component beam pair after passage through said material and measuring the relative phase shift produced in said beam pair by the characteristic of the material at a pixel in the focal plane of said component beam pair.

22. A method for storing data with three-dimensional resolution, comprising:

selectively producing a single, intense beam of coherent light representing data to be stored;

focussing said beam to produce a focal region within a three-dimensional photosensitive optical storage material capable of optically sensible characteristic changes upon two-photon excitation;

scanning said focal region within said storage material to plural locations in said material and causing said beam to produce two-photon excitation at selected locations within said material to produce at said selected locations characteristic changes in said material representing said data to be stored.

23. The method of claim 22, wherein the step of scanning includes moving said focal region to plural locations in an x-y plane within said storage material to define a plurality of pixel locations in said plane, said beam producing two-photon excitation at selected pixel locations to store data.

24. The material of claim 23, wherein the step of scanning further includes moving said focal region in a z direction perpendicular to said x-y plane to define at least a second x-y plane parallel to said first-mentioned x-y plane to define a three-dimensional array of pixel locations in said storage material.

25. The method of claim 24, further including detecting stored data by optically detecting said characteristic changes at selected locations.

26. The method of claim 25, wherein the step of optically detecting characteristic changes includes:

producing a pair of cross-polarized component read beams;

focussing said component beams at adjacent pixel locations within said storage medium to produce an optical interference signal corresponding to said characteristic changes in said storage material at said adjacent pixel locations; and determining from said interference pattern the data stored at said pixel locations.

27. The method of claim 25, wherein the step of optically detecting characteristic changes includes:
producing a polarized read beam;
producing from said read beam a pair of diverging cross-polarized component beams;
focussing said pair of component beams at adjacent locations within said storage medium so that when only one of the component beams passes through a location exhibiting a characteristic change the relative phases of the component beams will be changed;
recombining said pair of beams so that any change in the relative phases of said beams will produce in the recombined beam a polarization different from that of said read beam; and
determining from the difference in polarization the existence of said characteristic change at said location.

* * * * *

UNITED STATES PATENT AND TRADEMARK OFFICE
CERTIFICATE OF CORRECTION

PATENT NO. : 5,289,407

DATED : February 22, 1994

INVENTOR(S) : Strickler et al

It is certified that error appears in the above-indentified patent and that said Letters Patent is hereby corrected as shown below:

Column 7

Claim 11, line 36, "prison" should be --prism--.

Claim 16, line 65, after "said" (second ocurrence) insert --photosensitive--.

Signed and Sealed this

Twenty-eighth Day of June, 1994

Attest:

BRUCE LEHMAN

Attesting Officer     Commissioner of Patents and Trademarks